US011087806B2

(12) United States Patent
Miyano et al.

(10) Patent No.: US 11,087,806 B2
(45) Date of Patent: *Aug. 10, 2021

(54) APPARATUSES AND METHODS FOR ADJUSTING DELAY OF COMMAND SIGNAL PATH

(71) Applicant: Micron Technology, Inc., Boise, ID (US)

(72) Inventors: Kazutaka Miyano, Sagamihara (JP); Atsuko Momma, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 68 days.

This patent is subject to a terminal disclaimer.

(21) Appl. No.: 16/000,149

(22) Filed: Jun. 5, 2018

(65) Prior Publication Data

US 2018/0286470 A1   Oct. 4, 2018

Related U.S. Application Data

(63) Continuation of application No. 15/243,651, filed on Aug. 22, 2016, now Pat. No. 9,997,220.

(51) Int. Cl.
*G11C 7/22* (2006.01)
*G11C 7/10* (2006.01)

(52) U.S. Cl.
CPC .................. *G11C 7/22* (2013.01); *G11C 7/10* (2013.01); *G11C 7/1057* (2013.01);
(Continued)

(58) Field of Classification Search
CPC ........... G11C 7/22; G11C 7/10; G11C 7/1057; G11C 7/1066; G11C 7/1084; G11C 7/222; G11C 2207/2272
(Continued)

(56) References Cited

U.S. PATENT DOCUMENTS 4,644,248 A    2/1987  Brennen et al.
5,004,933 A    4/1991  Widener
(Continued)

FOREIGN PATENT DOCUMENTS

CN    1755577 A    4/2006
CN    1952868 A    4/2007
(Continued)

OTHER PUBLICATIONS

U.S. Appl. No. 16/107,909 titled "Methods and Apparatuses Including Command Delay Adjustment Circuit", filed Aug. 21, 2018, pp. all.

(Continued)

*Primary Examiner* — Sung Il Cho
(74) *Attorney, Agent, or Firm* — Dorsey & Whitney LLP

(57) ABSTRACT

Apparatuses and methods related to adjusting a delay of a command signal path are disclosed. An example apparatus includes: a timing circuit that includes a divider circuit that receives a first clock signal having a first frequency and provides a complementary pair of second and third clock signals having a second frequency that is half the first frequency; a first delay circuit that receives the second clock signal and provides a delayed second clock signal responsive to the second clock signal; and a second delay circuit that receives the third clock signal and provides a delayed third clock signal responsive to the third clock signal. The timing circuit receives a first signal, latches the first signal responsive to the delayed second clock signal to provide a second signal and latches the second signal responsive to either the second clock signal or the third clock signal responsive to latency information.

25 Claims, 7 Drawing Sheets

(52) U.S. Cl.
CPC .......... *G11C 7/1066* (2013.01); *G11C 7/1084* (2013.01); *G11C 7/222* (2013.01); *G11C 2207/2272* (2013.01)

(58) Field of Classification Search
USPC .................................................. 365/189.05
See application file for complete search history.

(56) References Cited

U.S. PATENT DOCUMENTS

| | | | |
|---|---|---|---|
| 5,610,558 A | 3/1997 | Mittel et al. | |
| 5,935,253 A | 8/1999 | Conary et al. | |
| 5,959,900 A | 9/1999 | Matsubara | |
| 6,111,810 A | 8/2000 | Fujita | |
| 6,198,689 B1 | 3/2001 | Yamazaki et al. | |
| 6,219,384 B1 | 4/2001 | Kliza et al. | |
| 6,240,045 B1 | 5/2001 | Haraguchi et al. | |
| 6,260,128 B1 | 7/2001 | Ohshima et al. | |
| 6,269,050 B1 | 7/2001 | Kwon et al. | |
| 6,275,077 B1 | 8/2001 | Tobin et al. | |
| 6,292,040 B1 | 9/2001 | Iwamoto et al. | |
| 6,295,245 B1 | 9/2001 | Tomita et al. | |
| 6,327,318 B1 | 12/2001 | Bhullar et al. | |
| 6,424,592 B1 | 7/2002 | Maruyama | |
| 6,438,055 B1 | 8/2002 | Taguchi et al. | |
| 6,449,674 B1 | 9/2002 | Yun et al. | |
| 6,459,313 B1 | 10/2002 | Godbee et al. | |
| 6,489,823 B2 | 12/2002 | Iwamoto | |
| 6,510,095 B1 | 1/2003 | Matsuzaki et al. | |
| 6,636,110 B1 | 10/2003 | Ooishi et al. | |
| 6,687,185 B1 | 2/2004 | Keeth et al. | |
| 6,710,726 B2 | 3/2004 | Kim et al. | |
| 6,744,285 B2 | 6/2004 | Mangum et al. | |
| 6,759,881 B2 | 7/2004 | Kizer et al. | |
| 6,781,861 B2 | 8/2004 | Gomm et al. | |
| 6,839,288 B1 | 1/2005 | Kim et al. | |
| 6,861,901 B2 | 3/2005 | Prexl et al. | |
| 6,868,504 B1 | 3/2005 | Lin | |
| 6,885,252 B2 | 4/2005 | Hsu | |
| 6,914,798 B2 | 7/2005 | Kwon et al. | |
| 6,930,955 B2 | 8/2005 | Johnson et al. | |
| 6,952,462 B2 | 10/2005 | Harrison | |
| 6,973,008 B2 | 12/2005 | Krause | |
| 6,980,479 B2 | 12/2005 | Park | |
| 6,988,218 B2 | 1/2006 | Drexler | |
| 7,042,799 B2 | 5/2006 | Cho | |
| 7,046,060 B1 | 5/2006 | Minzoni et al. | |
| 7,058,799 B2 | 6/2006 | Johnson | |
| 7,061,941 B1 | 6/2006 | Zheng | |
| 7,065,001 B2 | 6/2006 | Johnson et al. | |
| 7,111,185 B2 | 9/2006 | Gomm et al. | |
| 7,119,591 B1 | 10/2006 | Lin | |
| 7,158,443 B2 | 1/2007 | Lin | |
| 7,170,819 B2 | 1/2007 | Szczypinski | |
| 7,187,599 B2 | 3/2007 | Schnell et al. | |
| 7,209,396 B2 | 4/2007 | Schnell | |
| 7,248,512 B2 | 7/2007 | Shin | |
| 7,268,605 B2 | 9/2007 | Fang et al. | |
| 7,269,754 B2 | 9/2007 | Ramaswamy et al. | |
| 7,280,430 B2 | 10/2007 | Lee | |
| 7,319,728 B2 | 1/2008 | Bell et al. | |
| 7,336,752 B2 | 2/2008 | Vlasenko et al. | |
| 7,340,632 B2 | 3/2008 | Park | |
| 7,355,464 B2 | 4/2008 | Lee | |
| 7,375,560 B2 * | 5/2008 | Lee .................. | G11C 7/1066 327/141 |
| 7,411,852 B2 | 8/2008 | Nishioka et al. | |
| 7,428,284 B2 | 9/2008 | Lin | |
| 7,443,216 B2 | 10/2008 | Gomm et al. | |
| 7,451,338 B2 | 11/2008 | Lemos | |
| 7,463,534 B2 | 12/2008 | Ku et al. | |
| 7,489,172 B2 * | 2/2009 | Kim .................. | H03L 7/0805 327/147 |
| 7,509,517 B2 | 3/2009 | Matsumoto et al. | |
| 7,541,851 B2 | 6/2009 | Gomm et al. | |
| 7,580,321 B2 * | 8/2009 | Fujisawa .................. | G11C 7/22 365/230.06 |
| 7,590,013 B2 | 9/2009 | Yu et al. | |
| 7,593,273 B2 | 9/2009 | Chu et al. | |
| 7,609,584 B2 | 10/2009 | Kim et al. | |
| 7,616,040 B2 | 11/2009 | Motomura | |
| 7,631,248 B2 | 12/2009 | Zakharchenko et al. | |
| 7,643,334 B1 | 1/2010 | Lee et al. | |
| 7,656,745 B2 | 2/2010 | Kwak | |
| 7,660,187 B2 | 2/2010 | Johnson et al. | |
| 7,663,946 B2 | 2/2010 | Kim | |
| 7,671,648 B2 | 3/2010 | Kwak | |
| 7,675,439 B2 | 3/2010 | Chang et al. | |
| 7,675,791 B2 | 3/2010 | Kim | |
| 7,698,589 B2 | 4/2010 | Huang | |
| 7,715,260 B1 | 5/2010 | Kuo et al. | |
| 7,716,510 B2 | 5/2010 | Kwak | |
| 7,751,261 B2 | 7/2010 | Cho | |
| 7,773,435 B2 | 8/2010 | Cho | |
| 7,822,904 B2 | 10/2010 | LaBerge | |
| 7,826,305 B2 | 11/2010 | Fujisawa | |
| 7,826,583 B2 | 11/2010 | Jeong et al. | |
| 7,872,924 B2 | 1/2011 | Ma | |
| 7,876,640 B2 | 1/2011 | Lin | |
| 7,885,365 B2 | 2/2011 | Hagleitner et al. | |
| 7,913,103 B2 | 3/2011 | Gold et al. | |
| 7,928,782 B2 | 4/2011 | Booth et al. | |
| 7,945,800 B2 | 5/2011 | Gomm et al. | |
| 7,948,817 B2 * | 5/2011 | Coteus .................. | G11C 7/1051 365/194 |
| 7,969,813 B2 | 6/2011 | Bringivijayaraghavan et al. | |
| 7,970,090 B1 | 6/2011 | Tetzlaff | |
| 7,983,094 B1 | 7/2011 | Roge et al. | |
| 8,004,884 B2 | 8/2011 | Franceschini et al. | |
| 8,018,791 B2 | 9/2011 | Kwak | |
| 8,030,981 B2 | 10/2011 | Kim | |
| 8,115,529 B2 | 2/2012 | Shibata | |
| 8,116,415 B2 | 2/2012 | Wada et al. | |
| 8,144,529 B2 | 3/2012 | Chuang et al. | |
| 8,321,714 B2 | 11/2012 | Wu et al. | |
| 8,358,546 B2 | 1/2013 | Kim et al. | |
| 8,392,741 B2 | 3/2013 | Kim et al. | |
| 8,441,888 B2 | 5/2013 | Bringivijayaraghavan et al. | |
| 8,509,011 B2 | 8/2013 | Bringivijayaraghavan | |
| 8,536,915 B1 | 9/2013 | Terrovitis | |
| 8,644,096 B2 | 2/2014 | Bringivijayaraghavan | |
| 8,717,078 B2 | 5/2014 | Idgunji et al. | |
| 8,732,509 B2 | 5/2014 | Kwak | |
| 8,788,896 B2 | 7/2014 | Tekumalla | |
| 9,001,955 B2 | 4/2015 | Lamanna et al. | |
| 9,053,815 B2 | 6/2015 | Bell | |
| 9,054,675 B2 | 6/2015 | Mazumder et al. | |
| 9,166,579 B2 | 10/2015 | Huber et al. | |
| 9,329,623 B2 | 5/2016 | Vankayala | |
| 9,508,409 B2 | 11/2016 | Kwak | |
| 9,529,379 B2 | 12/2016 | Kwak | |
| 9,530,473 B2 | 12/2016 | Mazumder | |
| 9,531,363 B2 | 12/2016 | Miyano | |
| 9,601,170 B1 | 3/2017 | Mazumder et al. | |
| 9,813,067 B2 | 11/2017 | Ma et al. | |
| 9,865,317 B2 | 1/2018 | Ishibashi et al. | |
| 9,997,220 B2 | 6/2018 | Miyano et al. | |
| 10,193,558 B2 | 1/2019 | Ma et al. | |
| 10,224,938 B2 | 3/2019 | Takahashi | |
| 10,290,336 B2 | 5/2019 | Ishibashi et al. | |
| 10,658,019 B2 | 5/2020 | Kwak | |
| 2001/0015924 A1 | 8/2001 | Arimoto et al. | |
| 2002/0027451 A1 | 3/2002 | Shinozaki | |
| 2002/0054515 A1 | 5/2002 | Kang | |
| 2002/0057624 A1 | 5/2002 | Manning | |
| 2002/0085427 A1 | 7/2002 | Yi | |
| 2002/0087750 A1 | 7/2002 | Yi | |
| 2002/0110035 A1 | 8/2002 | Li et al. | |
| 2002/0149506 A1 | 10/2002 | Altrichter et al. | |
| 2003/0117864 A1 | 6/2003 | Hampel et al. | |
| 2003/0147299 A1 | 8/2003 | Setogawa | |
| 2003/0161210 A1 | 8/2003 | Acharya et al. | |
| 2004/0000934 A1 | 1/2004 | Jeon | |
| 2004/0008064 A1 | 1/2004 | Kashiwazaki | |

(56) References Cited

U.S. PATENT DOCUMENTS

| | | |
|---|---|---|
| 2004/0041604 A1 | 3/2004 | Jade et al. |
| 2005/0017774 A1 | 1/2005 | Chow et al. |
| 2005/0024107 A1 | 2/2005 | Takai et al. |
| 2005/0047222 A1 | 3/2005 | Rentschler |
| 2005/0052309 A1 | 3/2005 | Wang |
| 2005/0058012 A1 | 3/2005 | Yamauchi et al. |
| 2005/0132043 A1 | 6/2005 | Wang et al. |
| 2005/0184780 A1 | 8/2005 | Chun |
| 2005/0249028 A1 | 11/2005 | Harrison |
| 2005/0270852 A1 | 12/2005 | Dietrich et al. |
| 2006/0033542 A1 | 2/2006 | Lin et al. |
| 2006/0055441 A1 | 3/2006 | Mcclannahan et al. |
| 2006/0062341 A1 | 3/2006 | Edmondson et al. |
| 2006/0064620 A1 | 3/2006 | Kuhn et al. |
| 2006/0077751 A1 | 4/2006 | Oh et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2006/0250861 A1 | 11/2006 | Park et al. |
| 2006/0250882 A1 | 11/2006 | Choi et al. |
| 2006/0250883 A1 | 11/2006 | Szczypinski |
| 2007/0033427 A1 | 2/2007 | Correale, Jr. et al. |
| 2007/0046346 A1 | 3/2007 | Minzoni |
| 2007/0086267 A1 | 4/2007 | Kwak |
| 2007/0088903 A1 | 4/2007 | Choi |
| 2007/0189103 A1 | 8/2007 | Johnson et al. |
| 2007/0192651 A1 | 8/2007 | Schoch |
| 2007/0291558 A1 | 12/2007 | Joo |
| 2008/0042705 A1 | 2/2008 | Kim et al. |
| 2008/0056019 A1 | 3/2008 | Kim et al. |
| 2008/0080267 A1 | 4/2008 | Lee |
| 2008/0080271 A1 | 4/2008 | Kim |
| 2008/0082707 A1 | 4/2008 | Gupta et al. |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0180144 A1 | 7/2008 | Mai |
| 2008/0204071 A1 | 8/2008 | Lee et al. |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |
| 2009/0219068 A1 | 9/2009 | Mizuhashi et al. |
| 2009/0232250 A1 | 9/2009 | Yamada et al. |
| 2009/0290445 A1* | 11/2009 | Kinoshita ............... G11C 7/222 365/230.08 |
| 2009/0315600 A1 | 12/2009 | Becker et al. |
| 2010/0001762 A1 | 1/2010 | Kim |
| 2010/0052739 A1 | 3/2010 | Shibata |
| 2010/0054060 A1 | 3/2010 | Ku |
| 2010/0058261 A1 | 3/2010 | Markov et al. |
| 2010/0066422 A1 | 3/2010 | Tsai |
| 2010/0124090 A1 | 5/2010 | Arai |
| 2010/0124102 A1 | 5/2010 | Lee et al. |
| 2010/0128543 A1 | 5/2010 | Kwon et al. |
| 2010/0142308 A1 | 6/2010 | Kim |
| 2010/0165769 A1 | 7/2010 | Kuroki |
| 2010/0165780 A1 | 7/2010 | Bains et al. |
| 2010/0177589 A1* | 7/2010 | Kinoshita ............ G11C 7/1027 365/233.11 |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0295584 A1* | 11/2010 | Sano .................. H03L 7/0991 327/145 |
| 2010/0327926 A1 | 12/2010 | Takahashi |
| 2011/0026318 A1 | 2/2011 | Franceschini et al. |
| 2011/0047319 A1 | 2/2011 | Jeon et al. |
| 2011/0055671 A1 | 3/2011 | Kim et al. |
| 2011/0057697 A1 | 3/2011 | Miyano |
| 2011/0058437 A1 | 3/2011 | Miyano |
| 2011/0102039 A1 | 5/2011 | Shin |
| 2011/0161732 A1 | 6/2011 | Park |
| 2011/0169501 A1 | 7/2011 | Sato |
| 2011/0194575 A1* | 8/2011 | Chen ...................... G06F 1/10 372/25 |
| 2011/0228625 A1 | 9/2011 | Bringivijayaraghavan et al. |
| 2011/0238866 A1 | 9/2011 | Zitlaw |
| 2011/0238941 A1 | 9/2011 | Xu et al. |
| 2011/0298505 A1 | 12/2011 | Khoury et al. |
| 2011/0298512 A1 | 12/2011 | Kwak |
| 2011/0304365 A1 | 12/2011 | Bunch |
| 2012/0084575 A1 | 4/2012 | Flores et al. |
| 2012/0124317 A1 | 5/2012 | Mirichigni et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2012/0305580 A1 | 12/2012 | Ellis |
| 2013/0002318 A1 | 1/2013 | Lu et al. |
| 2013/0002320 A1 | 1/2013 | Lin et al. |
| 2013/0021106 A1 | 1/2013 | Bracmard et al. |
| 2013/0141994 A1 | 6/2013 | Ito et al. |
| 2013/0194013 A1 | 8/2013 | Kwak |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0177361 A1 | 6/2014 | Kitagawa |
| 2014/0258764 A1 | 9/2014 | Kwak |
| 2014/0293719 A1 | 10/2014 | Jung |
| 2014/0340158 A1 | 11/2014 | Thandri et al. |
| 2015/0097604 A1 | 4/2015 | Taniguchi |
| 2015/0156009 A1 | 6/2015 | Bogdan |
| 2015/0170725 A1 | 6/2015 | Kwak |
| 2015/0235691 A1 | 8/2015 | Kwak |
| 2015/0263739 A1* | 9/2015 | Jung .................... G11C 7/1057 327/149 |
| 2015/0263740 A1 | 9/2015 | Jung et al. |
| 2015/0340072 A1 | 11/2015 | Mazumder |
| 2016/0013799 A1 | 1/2016 | Li et al. |
| 2016/0056807 A1 | 2/2016 | Neidengard et al. |
| 2016/0308491 A1 | 10/2016 | Elgaard |
| 2016/0322964 A1 | 11/2016 | Miyano |
| 2016/0365860 A1 | 12/2016 | Ma et al. |
| 2017/0288682 A1 | 10/2017 | Ma et al. |
| 2017/0309320 A1 | 10/2017 | Ishibashi et al. |
| 2017/0309323 A1 | 10/2017 | Ishibashi et al. |
| 2018/0053538 A1 | 2/2018 | Miyano et al. |
| 2018/0054336 A1* | 2/2018 | Hori ...................... H04L 7/0008 |
| 2018/0238945 A1 | 8/2018 | Buck et al. |
| 2018/0358064 A1 | 12/2018 | Ishibashi et al. |
| 2018/0364752 A1 | 12/2018 | Li et al. |
| 2019/0036535 A1 | 1/2019 | Takahashi |
| 2019/0199360 A1 | 6/2019 | Takahashi |
| 2019/0302245 A1 | 10/2019 | Loinaz |
| 2019/0305865 A1 | 10/2019 | Loinaz |
| 2019/0360911 A1 | 11/2019 | Loinaz |

FOREIGN PATENT DOCUMENTS

| | | |
|---|---|---|
| CN | 101752009 A | 6/2010 |
| CN | 103137177 A | 6/2013 |
| JP | 2013-222997 A | 10/2013 |
| KR | 20050061997 A | 6/2005 |
| TW | 201303735 | 1/2013 |
| WO | 2017189127 A1 | 11/2017 |
| WO | 2018038835 A1 | 3/2018 |

OTHER PUBLICATIONS

International Preliminary Report on Patentability dated Feb. 26, 2019 for PCT Application No. PCT/US2017/043350, 12 pages.

(56) References Cited

OTHER PUBLICATIONS

U.S. Appl. No. 16/286,829, titled "Apparatuses and Methods for Indirectly Detecting Phase Variations", filed Feb. 27, 2019, pp. all.
U.S. Appl. No. 15/660,405, entitled "Apparatuses and Methods for Indirectly Detecting Phase Variations", filed Jul. 26, 2017, pp. all.
"Interfacing DDR SDRAM with Stratix II Devices", Version 3.2, Altera Corp, Sep. 2008, pp. all.
International Search Report and Written Opinion for. PCT Application No. PCT/US2017/043350, filed Oct. 24, 2017, pp. all.
Lee: "How to Implement DDR SGRAM in Graphic System", Samsung Electric, 4Q1998 (Oct.-Dec. 1998), pp. all.
English translation of KR Office Action for Application No. 10-2019-7007919, dated Apr. 22, 2020, pp. all.
EN Translation of KR Office Action dated Nov. 9, 2020 for KR Application No. 10-2019-7007919 3 pgs.
EN translation of KR Office Action dated May 14, 2021 for KR Application No. 10-2019-7007919.

\* cited by examiner

APPARATUSES AND METHODS FOR ADJUSTING DELAY OF COMMAND SIGNAL PATH

CROSS REFERENCE TO RELATED APPLICATION(S)

This application is a continuation of U.S. patent application Ser. No. 15/243,651 filed Aug. 22, 2016 and issued as U.S. Pat. No. 9,997,220 on Jun. 12, 2018. The aforementioned application, and issued patent, is incorporated herein by reference, in its entirety, for any purpose.

TECHNICAL FIELD

Embodiments of the invention relate generally to semiconductor memory, and more specifically, in one or more described embodiments, to signal paths and adjusting the timing of command signals through the signal path.

BACKGROUND OF THE INVENTION

In semiconductor memory, proper operation of the memory is based on the correct timing of various internal command and clock signals. For example, in reading data from the memory, internal clock signals that clock data path circuitry to provide (e.g. output) the read data may need to be provided substantially concurrently with internal read command signals to properly enable the data path circuitry to output the read data. If the timing of the internal read command signal is not such that the data path circuitry is enabled at the time the internal clock signal clocks the data path circuitry to output the read data at an expected time, the read command may be inadvertently ignored or the read data provided by the memory may not be correct (e.g., the data associated with another read command). Likewise, in writing data to memory internal clock signals that clock data path circuitry to latch write data may need to be provided with specific timing relationships with internal write command signals to properly enable the data path circuitry to provide the latched write data for writing to memory. Inaccurate timing of the internal command and clock signals could result in the write command being inadvertently ignored or incorrect write data being provided to the memory may (e.g., the write data is associated with another write command). Another example of a command that may require the correct timing of internal clock signals and the command for proper operation include, for example, on-die termination enable commands.

Moreover, as known, a "latency" may be selected (e.g., programmed, desired, used, given, etc.) to set a time, typically in numbers of clock periods T, between receipt of a read command by the memory and when the data is output by the memory. A "write latency" may also be selected to set a time, also typically in numbers of T, between receipt of a write command by the memory and when the write data is provided to the memory. The latencies may be selected, for example, to accommodate clock signals of different frequencies (i.e., different clock periods).

Complicating the generating of correctly timed internal clock and command signals is the relatively high frequency of memory clock signals, such as 1 GHz or higher. For example, memory clock signals can exceed 1 GHz. Further complicating the matter is that multi-data rate memories may provide and receive data at a rate higher than the memory clock signal, which may represent the rate at which commands may be executed. As a result, command signals and an internal clock signal may need to be in sync in order to maintain proper timing. An example of a multi-data rate memory is one that outputs read data at a rate twice that of the clock frequency, such as outputting data synchronized with clock edges of the memory clock signal.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
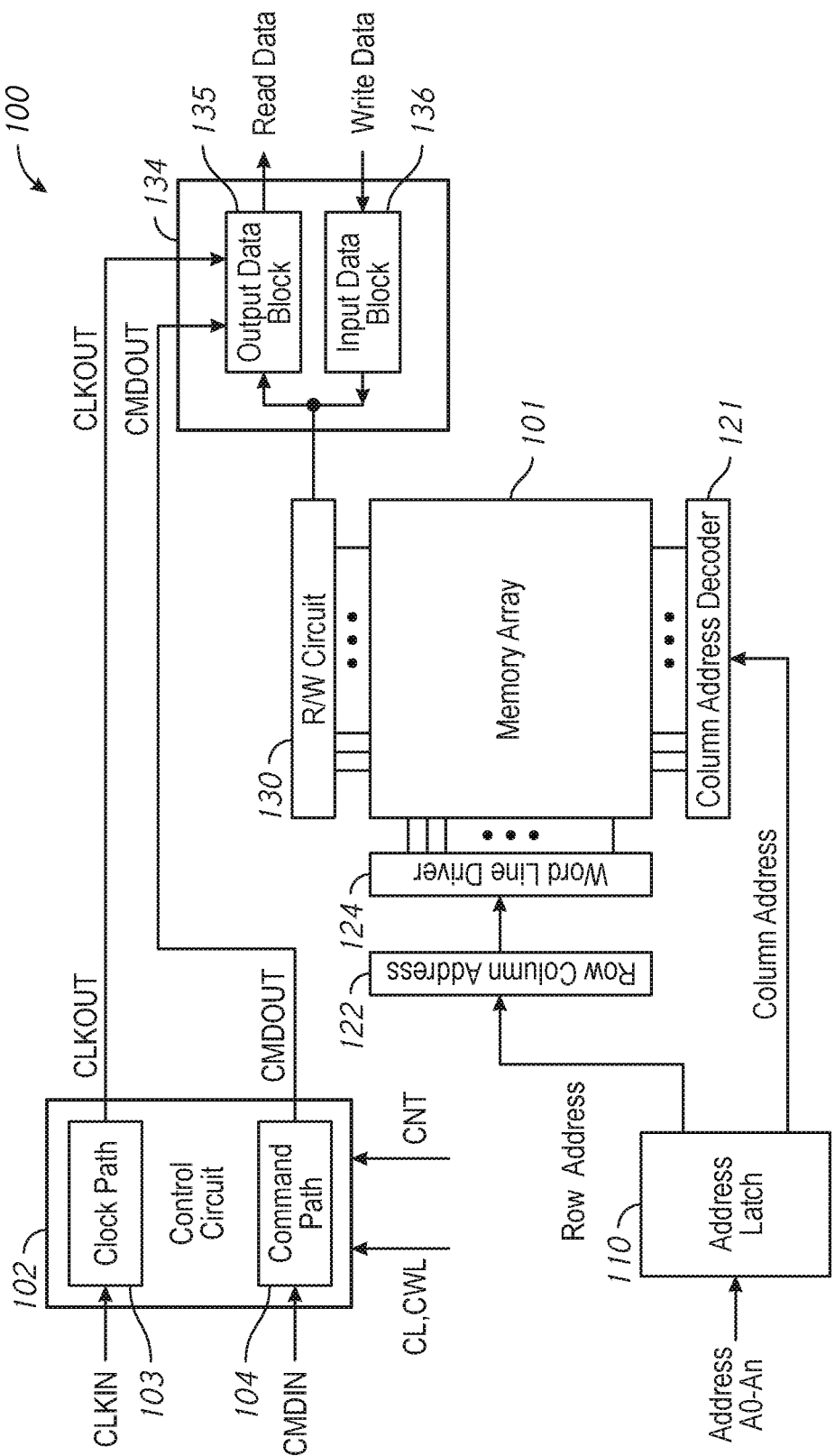
FIG. 1 is a block diagram of an apparatus including a control circuit in accordance with an embodiment of the present disclosure.

FIG. 1 is a block diagram of a portion of an apparatus 100 including a control circuit in accordance with an embodiment of the present disclosure. As used herein, an "apparatus" can refer to, for example, circuitry, a semiconductor die, a device, or a system. The apparatus 100 includes a memory array 101 of memory cells, which may be, for example, dynamic random access memory (DRAM) memory cells, static random access memory (SRAM) memory cells, flash memory cells, or some other types of memory cells. The apparatus 100 includes a control circuit 102 that receives memory commands and provides (e.g., generates) corresponding control signals within the apparatus 100 to execute various memory operations.

Row and column address signals are provided (e.g., applied) to the apparatus 100 via an address latch 110. The address latch captures the received address signals, and then provides a column address and a row address to a column address decoder 121 and a row address decoder 122, respectively. The column address decoder 121 selects bit lines extending through the memory array 101 corresponding to respective column addresses. The row address decoder 122 is coupled to a word line driver 124 that activates respective rows of memory cells in the memory array 101 corresponding to received row addresses. The selected data line (e.g., a bit line or bit lines) corresponding to a received column address are coupled to a read/write circuit 130 to provide read data to an input/output (I/O) data block 134. Write data are provided to the memory array 101 through the I/O data block 134 and the read/write circuit 130. The I/O data block 134 may include an output data block 135 and an input data block 136 that operate responsive to an internal clock signal CLKOUT and an internal command signal CMDOUT, for example. The output data block 135 may provide read data from the memory array 101, responsive to a command for read operations. In some embodiments, the output data block 135 may provide the read data responsive to the internal command signal CMDOUT. The input data block 136 may receive write data responsive to a command for write operations.

The control circuit 102 includes a clock path 103. The clock path 103 receives an external clock signal CLKIN and propagates an internal clock signal CLKOUT which is based at least in part on the external clock signal CLKIN to the I/O data block 134.

The control circuit 102 also includes a command path 104. The command path 104, which is shown in FIG. 1 as being included in the control circuit 102, but is not limited to such a configuration, provides the internal command signal CMDOUT to the I/O data block 134. The control circuit 102 responds to memory commands CMDIN to perform various operations on the memory array 101. In particular, the control circuit 102 is used to provide internal control signals to read data from and write data to the memory array 101. The command path 104 receives latency signals such as a CAS latency signal CL and a CAS write latency signal CWL. The command path 104 also receives internal clock signals from the clock path 103.

Figure 2:
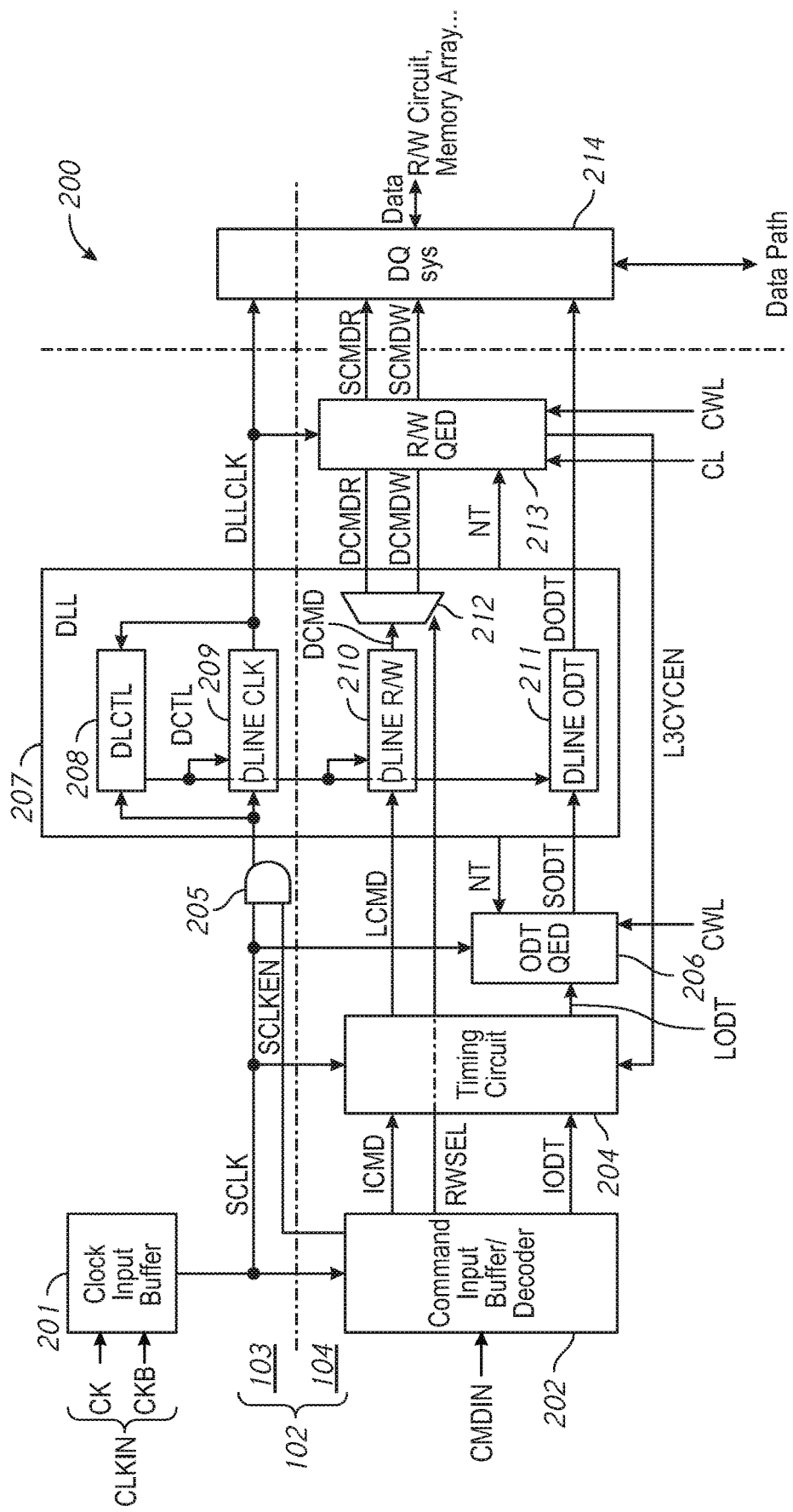
FIG. 2 is a block diagram of a control circuit, in accordance with an embodiment of the present disclosure.

FIG. 2 is a block diagram of a control circuit 200, in accordance with an embodiment of the present disclosure. For example, the control circuit 200 may be used as the control circuit 102 in FIG. 1 that may include the clock path 103 and the command path 104. The control circuit 200 may include a timing circuit 204 in the command path and a delay (DLL) circuit 207 among the clock path 103 and the command path 104. The clock path 103 includes a clock input buffer 201. The clock input buffer 201 may receive a pair of complementary clock signals CK and CKB based on a clock signal CLKIN, for example, and provides a system clock signal SCLK. The SCLK signal may be provided to a command input buffer/decoder circuit 202, a timing circuit 204, and an ODT dQ-Enable-Delay (QED) circuit 206 on the command path 104 and an AND circuit 205 on the clock path 103.

The DLL circuit 207 may include a delay line (DLINE CLK) 209 and a delay control (DLCTL) circuit 208 on the clock path 103. The SCLK signal may be provided to a delay line (DLINE CLK) 209 on the clock path 103 via the AND circuit 205 that may provide the SCLK signal responsive to a system clock enable signal SCLKEN that is responsive to the CMDIN signal indicative of the read command or the write command. Thus, the DLL circuit 207 may be active during the read and write operations. In some embodiments, the DLL circuit 207 may be inactive during the ODT operation. The DLL circuit 207 may adjust the delay of the delay lines 209, 210 and 211 by changing a delay control signal DCTL responsive to the SCLK signal and a DLL clock signal when it is activated. On the other hand, the DLL circuit 207 may keep the delay of the delay lines 209, 210 and 211 without adjusting the delay when it is deactivated. For example, the delay line 209 may be an adjustable delay line including a duty cycle controller (DCC), a coarse delay line and a fine delay line. An adjustable delay of the delay line 209 may adjust based on a delay control signal DCTL provided by the DLCTL circuit 208. The delay line 209 may provide a DLL clock signal DLLCLK having the adjustable delay relative to the SCLK signal on the clock path 103. The DLCTL circuit 208 may provide the DCTL signal to the delay line 209, responsive to the SCLK signal from the AND circuit 205 and the DLLCLK signal. The delay line 209 may further provide the DLLCLK signal to a read/write (R/W) dQ-Enable-Delay (QED) circuit 213 on the command path 104.

The command path 104 in the control circuit 200 includes the command input buffer/decoder circuit 202. The command input buffer/decoder circuit 202 may receive command signals CMDIN and the SCLK signal. The CMDIN signals may convey a memory access command, such as a read command, a write command, or an on-die termination (ODT) command indicative of instructing a read operation, a write operation or an on-die termination, respectively. The command input buffer/decoder circuit 202 may decode the CMDIN signals, responsive to the SCLK signal. The command input buffer/decoder circuit 202 may provide an internal command signal ICMD to the timing circuit 204 and may further provide a read/write selection signal RWSEL indicative or read operation or write operation and the SCLKEN signal responsive to the CMDIN signal indicative of the read command or the write command. The ICMD signal may be a read signal or a write signal. The timing circuit 204 may provide a latched command signal LCMD responsive to the ICMD signal and an L3CYCEN signal that may be described later in detail, where the timing circuit 204 may control a timing of the LCMD signal relative to the ICMD signal such that the LCMD signal is synchronized with the SCLK signal. The command input buffer/decoder circuit 202 may provide an internal ODT command signal IODT to the timing circuit 204 responsive to the CMDIN signal indicative of the ODT command. The IODT signal may be an on-die termination signal. The timing circuit 204 may provide a latched ODT command signal LODT responsive to the IODT signal and an L3CYCEN signal that may be described later in detail. The timing circuit 204 may control a timing of the LODT signal relative to the IODT signal.

The ODT QED circuit 206 may receive the SCLK signal. The ODT QED circuit 206 may further receive an NT value that may indicate a number of clock cycles equivalent to a delay of the DLLCLK signal relative to the SCLK signal and a CAS writing latency signal CWL. The CWL value is CAS write latency that may account for a delay time between when an apparatus receives a write command and when the input data block 136 in FIG. 1 receives write data responsive to the write command based on DQS signals (not shown) including time for data to be accessed and provided to an input bus (e.g., via a DQ pad before the input data block 136). The CWL value may be frequency dependent value and represented as numbers of clock cycles of the SCLK signal. For example, the ODT QED circuit 206 may be a delay circuit that may adjust the LODT signal from the timing circuit 204 with the SCLK signal from the clock input buffer 201, for example, by adjusting a latency (e.g., shifting, delaying) of the LODT signal using the NT value and the CWL value. For example, in some embodiments, the ODT QED circuit 206 may shift the LODT signal for the ODT command responsive to the CWL. An adjustment factor may also be considered. For example, in some embodiments, the NT value may be greater than or equal to nine. For example, in some embodiments, the CWL value and the NT value may have to satisfy a condition that a difference between the CWL value and the NT value (e.g., CWL-NT) is greater or equal to two. The ODT QED circuit 206 may provide a shifted ODT signal SODT that is the shifted LODT signal.

The DLL circuit 207 may further include a delay line (DLINE ODT) 211 coupled to the ODT QED circuit 206 on the command path 104. For example, the delay line 211 may be an adjustable delay line including a DCC, a coarse delay line and a fine delay line. In some embodiments, the delay line 211 may have substantially the same circuit structure as the delay line 209 and may provide substantially the same delay as the delay line 209. An adjustable delay of the delay line 211 may adjust based on the delay control signal DCTL provided by the DLCTL circuit 208. The SODT signal from the ODT QED circuit 206 is transmitted to the delay line 211. The delay line 211 may provide a delayed ODT signal DODT responsive to the SODT signal and further responsive to the DCTL signal that is based on the SCLK signal and the DLLCLK signal.

The DLL circuit 207 may further include a delay line (DLINE R/W) 210 coupled to the timing circuit 204 on the command path 104. For example, the delay line 210 may be an adjustable delay line including a DCC, a coarse delay line and a fine delay line. In some embodiments, the delay line 210 may have substantially the same circuit structure as the delay line 209 and may provide substantially the same delay as the delay line 209. An adjustable delay of the delay line 210 may adjust based on the delay control signal DCTL provided by the DLCTL circuit 208. The LCMD signal from the timing circuit 204 is transmitted to the delay line 210. The delay line 210 may provide a delayed command signal DCMD responsive to the LCMD signal and further responsive to the DCTL signal that is based on the SCLK signal and the DLLCLK signal. The DCMD signal may be transmitted to a demultiplexer 212. The demultiplexer 212 may provide either a delayed command read signal DCMDR or a delayed command write signal DCMDW responsive to the read command or the write command.

The command path 104 further includes the R/W QED circuit 213. The R/W QED circuit 213 may receive a selected latency (e.g., a CL value and/or a CWL value) and an NT value. The R/W QED circuit 213 may further receive the DLLCLK signal from the delay line 209. The latency may be defined by a number of clock cycles, for example, of the CLK signal. The NT value may be a number of clock cycles equivalent to a delay between receipt of the SCLK signal and the DLLCLK signal. The CL value is column address strobe (CAS) latency that may account for a delay time between when the apparatus receives the read command and when an output buffer in a data queue system (DQ sys) circuit 214 receives read data responsive to the read command based on a clock signal (e.g., the DLLCLK signal) including time for data to be accessed and provided to an output bus (e.g., via a DQ pad in the DQ sys circuit 214). The CWL value is CAS write latency that may account for a delay time between when the apparatus receives the write command and when the input data block 136 in FIG. 1 receives write data responsive to the write command based on DQS signals (not shown) including time for data to be accessed and provided to an input bus (e.g., via a DQ pad before the input data block 136). The CL value and the CWL value may be represented as numbers of clock cycles of the CLK signal. The CL value and the CWL value may be frequency dependent value, for example.

The R/W QED circuit 213 may synchronize the DCMDR signal or the DCMDW signal from the demultiplexer 212 with the DLLCLK signal from the delay line 209, for example, by adjusting a latency (e.g., shifting) of the DCMDR signal or the DCMDW signal using the NT value and the CL value or the CWL value. For example, in some embodiments, the R/W QED circuit 213 may shift the DCMDR signal for the read command responsive to the CL. In some embodiments, the R/W QED circuit 213 may shift the DCMDW signal for the write command responsive to the CWL. An adjustment factor may also be considered. For example, in some embodiments, the NT value may be greater than or equal to nine. For example, in some embodiments, the CL value and the NT value may have to satisfy the condition that a difference between the CL value and the NT value (e.g., CL−NT) is greater or equal to two. In some embodiments, the R/W QED circuit 213 shifts the DCMDR signal by (CL−(N+2)) clock cycles of the DLLCLK signal for read commands, where two is the adjustment factor. The R/W QED circuit 213 may provide a latency three-cycle-operation enable signal L3CYCEN to the timing circuit 204 responsive to latency information (e.g., based on a calculation of the CL value or the CWL value and the NT value). For example, (CL−NT) may be calculated and whether the (CL−NT) is greater than a predetermined value that is defined as a number of clock cycles is determined. If the (CL−NT) is greater than the predetermined value, the L3CYCEN signal may be activated and the timing circuit 204 may perform a three-cycle-operation that will be described later in detail. If the (CL−NT) is less than or equal to the predetermined value, the timing circuit 204 may perform a two-cycle-operation that will be described later in detail. In operation, the read command or the write represented by the CMDIN signal is provided to the command path 104 and propagated through the command input buffer/decoder circuit 202 as the ICMD signal, the timing circuit 204 as the LCMD signal, the delay line 210 as the DCMD signal, the demultiplexer 212 as the DCMDR signal or the DCMDW signal, and the R/W QED circuit 213. The R/W QED circuit 213 adds clock cycles of the DLLCLK signal to the propagating command signal, either the DCMDR signal or the DCMDW signal, to provide a shifted command read signal SCMDR or a shifted command write signal SCMDW resulting propagation delay for the command path 104 responsive to the selected latency.

The I/O data block 134 in FIG. 1 may include the DQ sys circuit 214 in FIG. 2. The DQ sys circuit 214 may receive the DLLCLK signal, the SCMDR signal and the SCMDW signal, the DODT signal. For example, the DQ sys circuit 214 may include a parallel-serial converter which converts data of a plurality of bits read in parallel from the memory array 101 in FIG. 1 via the R/W circuit 130 to a set of serial data in an appropriate order based on the timings. The DQ sys circuit 214 may provide the data to a data queue (e.g., DQx) on a data path.

Figure 3:
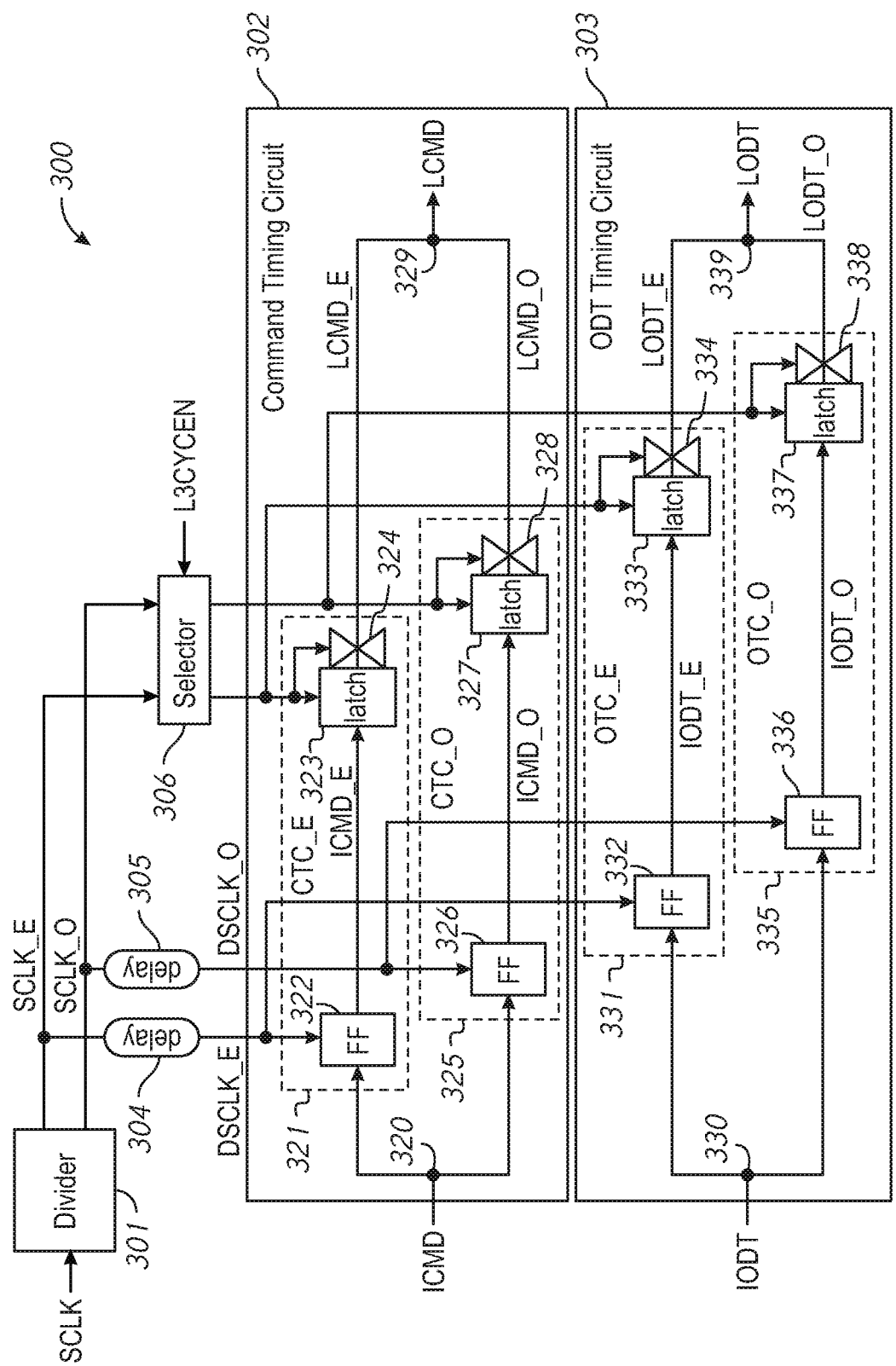
FIG. 3 is a block diagram of a timing circuit of FIG. 2, in accordance with an embodiment of the present disclosure.
Figure 4:
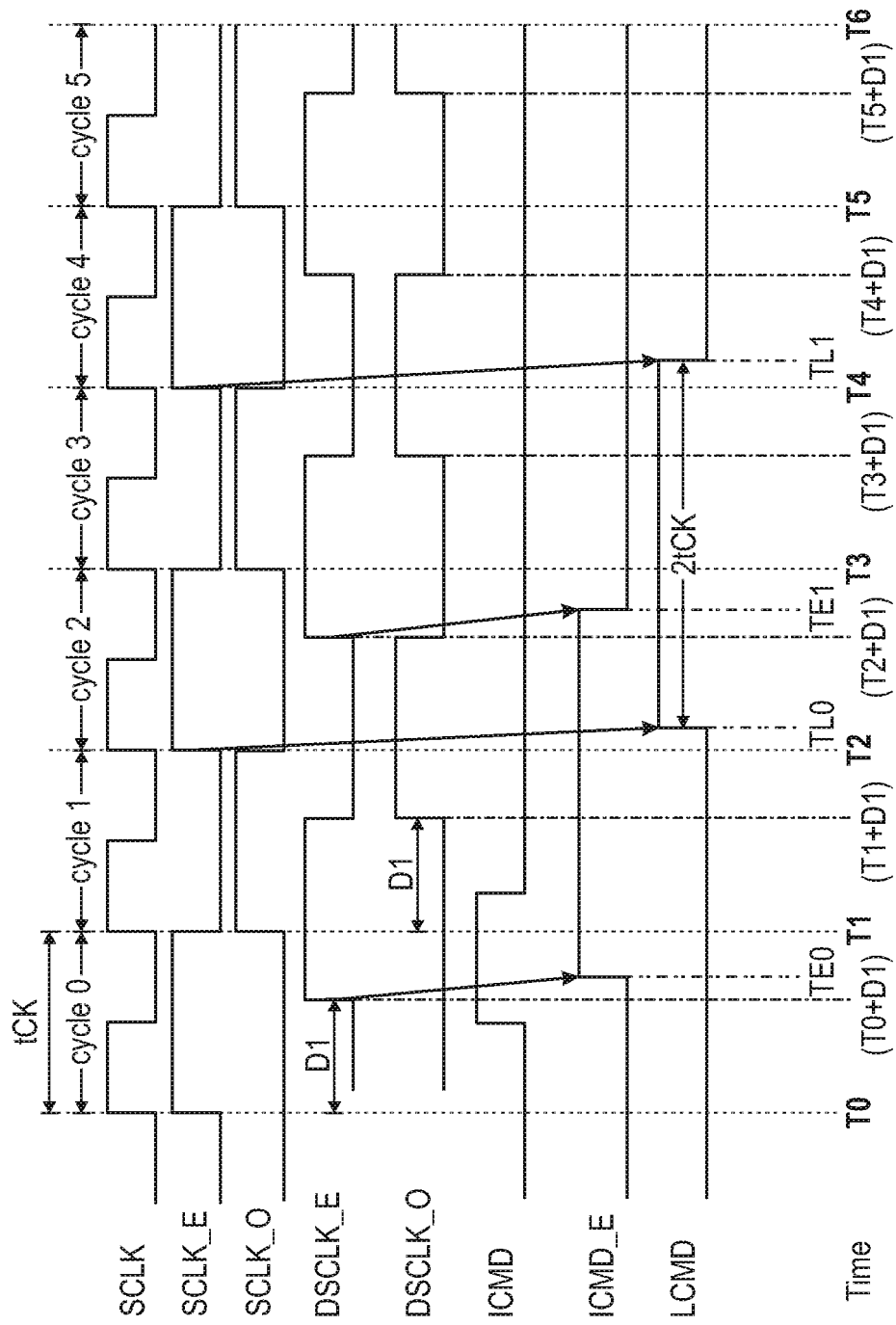
FIG. 4 is a timing diagram of various signals during operation of the timing circuit of FIG. 3 in accordance with an embodiment of the present disclosure.
Figure 5:
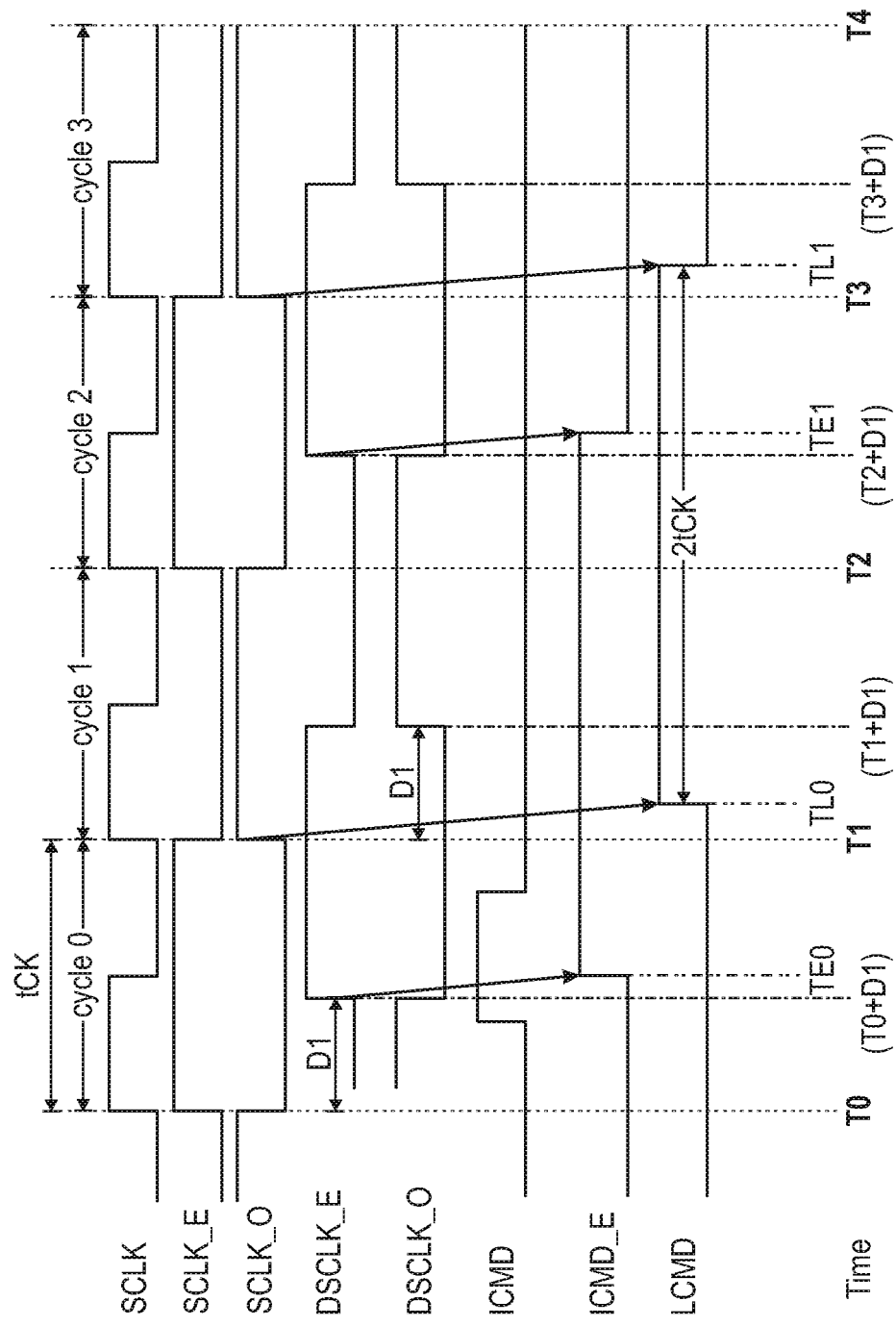
FIG. 5 is a timing diagram of various signals during operation of the timing circuit of FIG. 3 in accordance with an embodiment of the present disclosure.

FIG. 3 is a block diagram of a timing circuit 300, in accordance with an embodiment of the present disclosure. FIGS. 4 and 5 are timing diagrams of various signals during operations of the timing circuit of FIG. 3 in accordance with an embodiment of the present disclosure. For example, the timing circuit 300 may be used as the timing circuit 204 in FIG. 2. The timing circuit 300 may receive the system clock signal SCLK that has a clock cycle of tCK. The system clock signal SCLK may include even cycles (e.g., cycle 0, cycle 2 and cycle 4 in FIG. 4) and odd cycles (e.g., cycle 1, cycle 3 and cycle 5 in FIG. 4). The timing circuit 300 may include a divider circuit 301. The divider circuit 301 may be a frequency divider that may provide an even system clock signal SCLK_E and an odd system clock signal SCLK_O responsive to the SCLK signal. For example, the divider circuit 301 may divide a frequency of the SCLK signal, thus a frequency of the SCLK_E and the SCLK_O signals is substantially half the frequency of the SCLK signal. The SCLK_E signal may have even cycles of the SCLK signal as positive half cycles and odd cycles of the SCLK signal as negative half cycles. The SCLK_O signal is a complementary signal of the SCLK_E signal and the SCLK_O signal may have odd cycles of the SCLK signal as positive half cycles and even cycles of the SCLK signal as negative half cycles. In other words, a phase difference between the SCLK_E signal and the SCLK_O signal is about 180 degrees. The SCLK_E signal and the SCLK_O signal may have a clock cycle that is equivalent to two clock cycles of the SCLK (=2tCK).

The timing circuit 300 may include delay circuits 304 and 305, a selector circuit 306, a command timing circuit 302 and an ODT timing circuit 303. The command timing circuit 302 may include circuit nodes 320 and 329. The command timing circuit 302 may further include an even command timing circuit CTC_E 321 and an odd command timing circuit CTC_O 325 coupled between the circuit nodes 320 and 329. The ODT timing circuit 303 may include circuit nodes 330 and 339. The ODT timing circuit 303 may further include an even ODT timing circuit OTC_E 331 and an odd ODT timing circuit OTC_O 335 coupled between the circuit nodes 330 and 339. The delay circuit 304 may receive the SCLK_E signal and may further provide a delayed even system clock signal DSCLK_E having a delay D1 relative to the SCLK_E signal. The delay circuit 305 may receive the SCLK_O signal and may further provide a delayed odd system clock signal DSCLK_O having a delay D1 relative to the SCLK_O signal. The CTC_E 321 may include a flip-flop circuit (FF) 322 that may latch the ICMD signal on the circuit node 320 responsive to the DSCLK_E signal and may further provide an even internal command signal ICMD_E. The CTC_O 325 may include a flip-flop circuit (FF) 326 that may latch the ICMD signal on the circuit node 320 responsive to the DSCLK_O signal and may further provide an odd internal command signal ICMD_O. The OTC_E 331 may include a flip-flop circuit (FF) 332 that may latch the IODT signal on the circuit node 330 responsive to the DSCLK_E signal and may further provide an even ODT signal IODT_E. The OTC_O 335 may include a flip-flop circuit (FF) 336 that may latch the IODT signal on the circuit node 330 responsive to the DSCLK_O signal and may further provide an odd ODT signal IODT_O.

The timing circuit 300 may receive the L3CYCEN signal from the R/W QED circuit 213 in FIG. 2 at the selector circuit 306. The timing circuit 300 may perform the three-cycle-operation responsive to the active L3CYCEN signal (e.g., a logic high level) and may further perform the two-cycle-operation responsive to the inactive L3CYCEN signal (e.g., a logic low level). In the three-cycle-operation, time adjustment of the CMD signal and the ODT signal may use three clock cycles of the SCLK signal in the timing circuit 300. The selector circuit 306 may provide, in the three-cycle-operation, the SCLK_E signal to the CTC_E 321 and the OTC_E 331 responsive to the active L3CYCEN signal. The CTC_E 321 may include a latch circuit 323 and a switch 324. The latch circuit 323 may receive the ICMD_E signal and the SCLK_E signal and may further latch the ICMD_E signal responsive to the SCLK_E signal from the selector circuit 306. The switch 324 may provide an even latched command signal LCMD_E from the latch circuit 323 on the circuit node 329 responsive to the SCLK_E signal from the selector circuit 306. The OTC_E 331 may include a latch circuit 333 and a switch 334. The latch circuit 333 may receive the IODT_E signal and the SCLK_E signal and may further latch the IODT_E signal responsive to the SCLK_E signal from the selector circuit 306. The switch 334 may provide an even latched command signal LODT_E from the latch circuit 333 on the circuit node 339 responsive to the SCLK_E signal from the selector circuit 306. The selector circuit 306 may further provide, in the three-cycle-operation, the SCLK_O signal to the CTC_O 325 and the OTC_O 335 responsive to the active L3CYCEN signal. The CTC_O 325 may include a latch circuit 327 and a switch 328. The latch circuit 327 may receive the ICMD_O signal and the SCLK_O signal and may further latch the ICMD_O signal responsive to the SCLK_O signal from the selector circuit 306. The switch 328 may provide an odd latched command signal LCMD_O from the latch circuit 327 on the circuit node 329 responsive to the SCLK_O signal from the selector circuit 306. The OTC_O 335 may include a latch circuit 337 and a switch 338. The latch circuit 337 may receive the IODT_O signal and the SCLK_O signal and may further latch the IODT_O signal responsive to the SCLK_O signal from the selector circuit 306. The switch 338 may provide an odd latched command signal LODT_O from the latch circuit 337 on the circuit node 339 responsive to the SCLK_O signal from the selector circuit 306.

FIG. 4 is the timing diagram of various signals during operation of the timing circuit of FIG. 3 in the three-cycle-operation. Here, cycle 0, cycle 1, cycle 2, cycle 3, cycle 4, and cycle 5 of the SCLK signal are periods between T0 and T1, T1 and T2, T2 and T3, T3 and T4, T4 and T5, T5 and T6, respectively. The SCLK_E signal is active in cycles 0, 2, 4 and the SCLK_O signal is active in cycles 1, 3 and 5. The delay of the DSCLK_E signal relative to the SCLK_E signal provided by the delay circuit 304 is D1, and the DSCLK_E signal has rising edges at time T0+D1, T2+D1 and T4+D1. The delay of the DSCLK_O signal relative to the SCLK_O signal provided by the delay circuit 305 is D1, and the DSCLK_O signal has rising edges at time T1+D1, T3+D1 and T5+D1. For example, the FF 322 may latch the ICMD signal responsive to the rising edge of the DSCLK_E signal at time T0+D1 until the next rising edge of the DSCLK_E signal at time T2+D1. The FF 322 may provide the ICMD_E signal that has a rising edge at time TE0 and a falling edge at time TE1 responsive to the rising edges of the DSCLK_E signal at times T0+D1 and T2+D1, respectively. The latch circuit 323 may latch the ICMD_E signal responsive to the rising edge of the SCLK_E signal at time T2 until the next rising edge of the SCLK_E signal at time T4. The latch circuit 323 may provide the LCMD signal that has a rising edge at time TL0 (e.g., after T2) and a falling edge at time TL1 (e.g., after T4) responsive to the rising edges of the SCLK_E signal at times T2 and T4, respectively. Thus, a time period between a time when the CMD signal is deactivated and the time TL1 when the LCMD signal may be deactivated becomes approximately three clock cycles that is the time adjustment of the CMD signal at the timing circuit 300.

A latency value (e.g., CL) represented by a number of clock cycles may vary inversely with a clock cycle tCK of the SCLKS signal. For example, a longer clock cycle results in a smaller number of clock cycles representing the latency value. FIG. 5 is a timing diagram of various signals during operation of the timing circuit 300 of FIG. 3 in accordance with an embodiment of the present disclosure. For example, the operation of the timing circuit in the FIG. 5 is the two-cycle-operation. In the two-cycle-operation, the time adjustment of the CMD signal and the ODT signal may use two clock cycles of the SCLK signal in the timing circuit 300. The selector circuit 306 may provide the SCLK_O signal to the CTC_E 321 and the OTC_E 331 responsive to the inactive L3CYCEN signal. The latch circuit 323 may receive the ICMD_E signal and the SCLK_O signal and may further latch the ICMD_E signal responsive to the SCLK_O signal from the selector circuit 306. The switch 324 may provide an even latched command signal LCMD_E from the latch circuit 323 on the circuit node 329 responsive to the SCLK_O signal from the selector circuit 306. The latch circuit 333 may receive the IODT_E signal and the SCLK_O signal and may further latch the IODT_E signal responsive to the SCLK_O signal from the selector circuit 306. The switch 334 may provide an even latched command signal LODT_E from the latch circuit 333 on the circuit node 339 responsive to the SCLK_O signal from the selector circuit 306. The selector circuit 306 may provide the SCLK_E signal to the CTC_O 325 and the OTC_O 335 responsive to the inactive L3CYCEN signal. The latch circuit 327 may receive the ICMD_O signal and the SCLK_E signal and may further latch the ICMD_O signal responsive to the SCLK_E signal from the selector circuit 306. The switch 328 may provide an odd latched command signal LCMD_O from the latch circuit 327 on the circuit node 329 responsive to the SCLK_E signal from the selector circuit 306. The latch circuit 337 may receive the IODT_O signal and the SCLK_E signal and may further latch the IODT_O signal responsive to the SCLK_E signal from the selector circuit 306. The switch 338 may provide an odd latched command signal LODT_O from the latch circuit 337 on the circuit node 339 responsive to the SCLK_E signal from the selector circuit 306.

FIG. 5 is a timing diagram of various signals during operation of the timing circuit of FIG. 3 in accordance with an embodiment of the present disclosure. Here, cycle 0, cycle 1, cycle 2 and cycle 3 of the SCLK signal are periods between T0 and T1, T1 and T2, T2 and T3, T3 and T4, respectively. The SCLK_E signal is active in cycles 0 and 2 and the SCLK_O signal is active in cycles 1 and 3. The delay of the DSCLK_E signal relative to the SCLK_E signal provided by the delay circuit 304 is D1, and the DSCLK_E signal has rising edges at time T0+D1 and T2+D1. The delay of the DSCLK_O signal relative to the SCLK_O signal provided by the delay circuit 305 is D1, and the DSCLK_O signal has rising edges at time T1+D1 and T3+D1. For example, the FF 322 may latch the ICMD signal responsive to the rising edge of the DSCLK_E signal at time T0+D1 until the next rising edge of the DSCLK_E signal at time T2+D1. The FF 322 may provide the ICMD_E signal that has a rising edge at time TE0 and a falling edge at time TE1 responsive to the rising edges of the DSCLK_E signal at times T0+D1 and T2+D1, respectively. The latch circuit 323 may latch the ICMD_E signal responsive to the rising edge of the SCLK_O signal at time T1 until the next rising edge of the SCLK_O signal at time T3. The latch circuit 323 may provide the LCMD signal that has a rising edge at time TL0 (e.g., after T1) and a falling edge at time TL1 (e.g., after T3) responsive to the rising edges of the SCLK_O signal at times T1 and T3, respectively. Thus, a time period between a time when the CMD signal is deactivated and the time TL1 when the LCMD signal may be deactivated becomes shorter than three clock cycles that is the time adjustment of the CMD signal at the timing circuit 300.

Thus, the timing circuit 300 may adjust time represented by a number of clock cycles of the SCLK signal in response to the latency value. The latch circuits 323, 327, 333, 338 and the switches 324, 328, 334, 338 may provide high impedance output signals responsive to the inactive level of the selected clock signal from the selector circuit 306.

Figure 6:
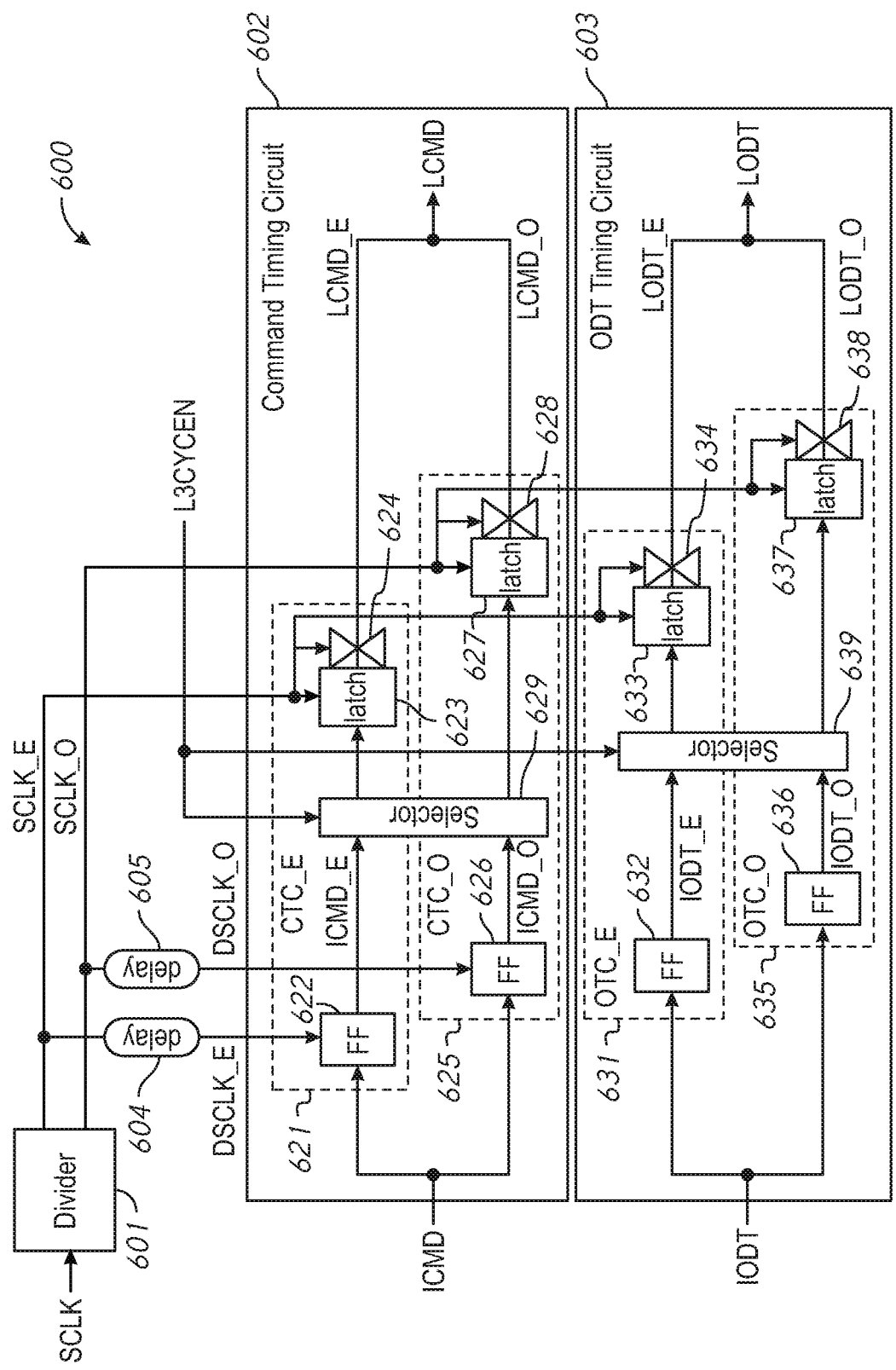
FIG. 6 is a block diagram of a timing circuit of FIG. 2, in accordance with an embodiment of the present disclosure.

FIG. 6 is a block diagram of a timing circuit 600 of FIG. 2, in accordance with an embodiment of the present disclosure. For example, the timing circuit 600 may be used as the timing circuit 204 in FIG. 2. The timing circuit 600 may include a divider circuit 601 and delay circuits 604 and 605 that have substantially the same circuit structure as the divider circuit 301 and the delay circuits 304 and 305 and the description of the divider circuit 601 and the delay circuits 604 and 605 will not be repeated. The timing circuit 600 may include a command timing circuit 602 and an ODT timing circuit 603. The command timing circuit 602 may include an even command timing circuit CTC_E 621 and an odd command timing circuit CTC_O 625. The ODT timing circuit 603 may include an even ODT timing circuit OTC_E 631 and an odd ODT timing circuit OTC_O 635. The CTC_E 621 may include a flip-flop circuit (FF) 622 that may latch the ICMD signal responsive to the DSCLK_E signal and may further provide an even internal command signal ICMD_E. The CTC_O 625 may include a flip-flop circuit (FF) 626 that may latch the ICMD signal responsive to the DSCLK_O signal and may further provide an odd internal command signal ICMD_O. The OTC_E 631 may include a flip-flop circuit (FF) 632 that may latch the IODT signal responsive to the DSCLK_E signal and may further provide an even ODT signal IODT_E. The OTC_O 635 may include a flip-flop circuit (FF) 636 that may latch the IODT signal responsive to the DSCLK_O signal and may further provide an odd ODT signal IODT_O.

The timing circuit 600 may perform the three-cycle-operation responsive to the active L3CYCEN signal (e.g., a logic high level) and may further perform the two-cycle-operation responsive to the inactive L3CYCEN signal (e.g., a logic low level). In the three-cycle-operation, time adjustment of the CMD signal and the ODT signal may use three clock cycles of the SCLK signal in the timing circuit 600. The timing circuit 600 may receive the L3CYCEN signal from the R/W QED circuit 213 in FIG. 2 at selector circuits 629 and 639. The command timing circuit 602 may include the selector circuit 629. The CTC_E 621 may include a latch circuit 623 and a switch 624. The CTC_O 625 may include a latch circuit 627 and a switch 628. The selector circuit 629 may provide the ICMD_E signal to the latch circuit 623 and the ICMD_O signal to the latch circuit 627 responsive to the active L3CYCEN signal. The latch circuit 623 may receive the ICMD_E signal and the SCLK_E signal and may further latch the ICMD_E signal responsive to the SCLK_E signal. The switch 624 may provide an even latched command signal LCMD_E from the latch circuit 623 responsive to the SCLK_E signal. The latch circuit 627 may receive the ICMD_O signal and the SCLK_O signal and may further latch the ICMD_O signal responsive to the SCLK_O signal. The switch 628 may provide an odd latched command signal LCMD_O from the latch circuit 627 responsive to the SCLK_O signal.

The ODT timing circuit 603 may include the selector circuit 639. The OTC_E 631 may include a latch circuit 633 and a switch 634. The OTC_O 635 may include a latch circuit 637 and a switch 638. The selector circuit 639 may provide the IODT_E signal to the latch circuit 633 and the IODT_O signal to the latch circuit 637 responsive to the active L3CYCEN signal. The latch circuit 633 may receive the IODT_E signal and the SCLK_E signal and may further latch the IODT_E signal responsive to the SCLK_E signal. The switch 634 may provide an even latched ODT signal LODT_E from the latch circuit 633 responsive to the SCLK_E signal. The latch circuit 637 may receive the IODT_O signal and the SCLK_O signal and may further latch the IODT_O signal responsive to the SCLK_O signal. The switch 638 may provide an odd latched ODT signal LODT_O from the latch circuit 637 responsive to the SCLK_O signal.

In the two-cycle-operation, the time adjustment of the CMD signal and the ODT signal may use two clock cycles of the SCLK signal in the timing circuit 600. The selector circuit 629 may provide the ICMD_O signal to the latch circuit 623 and the ICMD_E signal to the latch circuit 627 responsive to the inactive L3CYCEN signal. The latch circuit 623 may receive the ICMD_O signal and the SCLK_E signal and may further latch the ICMD_O signal responsive to the SCLK_E signal. The switch 624 may provide an even latched command signal LCMD_E from the latch circuit 623 responsive to the SCLK_E signal. The latch circuit 627 may receive the ICMD_E signal and the SCLK_O signal and may further latch the ICMD_E signal responsive to the SCLK_O signal. The switch 628 may provide an odd latched command signal LCMD_O from the latch circuit 627 responsive to the SCLK_O signal.

The selector circuit 639 may provide the IODT_O signal to the latch circuit 633 and the IODT_E signal to the latch circuit 637 responsive to the inactive L3CYCEN signal. The latch circuit 633 may receive the IODT_O signal and the SCLK_E signal and may further latch the IODT_O signal responsive to the SCLK_E signal. The switch 634 may provide an even latched ODT signal LODT_E from the latch circuit 633 responsive to the SCLK_E signal. The latch circuit 637 may receive the IODT_E signal and the SCLK_O signal and may further latch the IODT_E signal responsive to the SCLK_O signal. The switch 638 may provide an odd latched ODT signal LODT_O from the latch circuit 637 responsive to the SCLK_O signal.

Thus, the timing circuit 600 may provide the three-cycle operation and the two cycle operation having system clock signals, delayed system clock signals, internal command signals and the latched command signals having timings as illustrated in timing diagrams of FIGS. 4 and 5.

Figure 7:
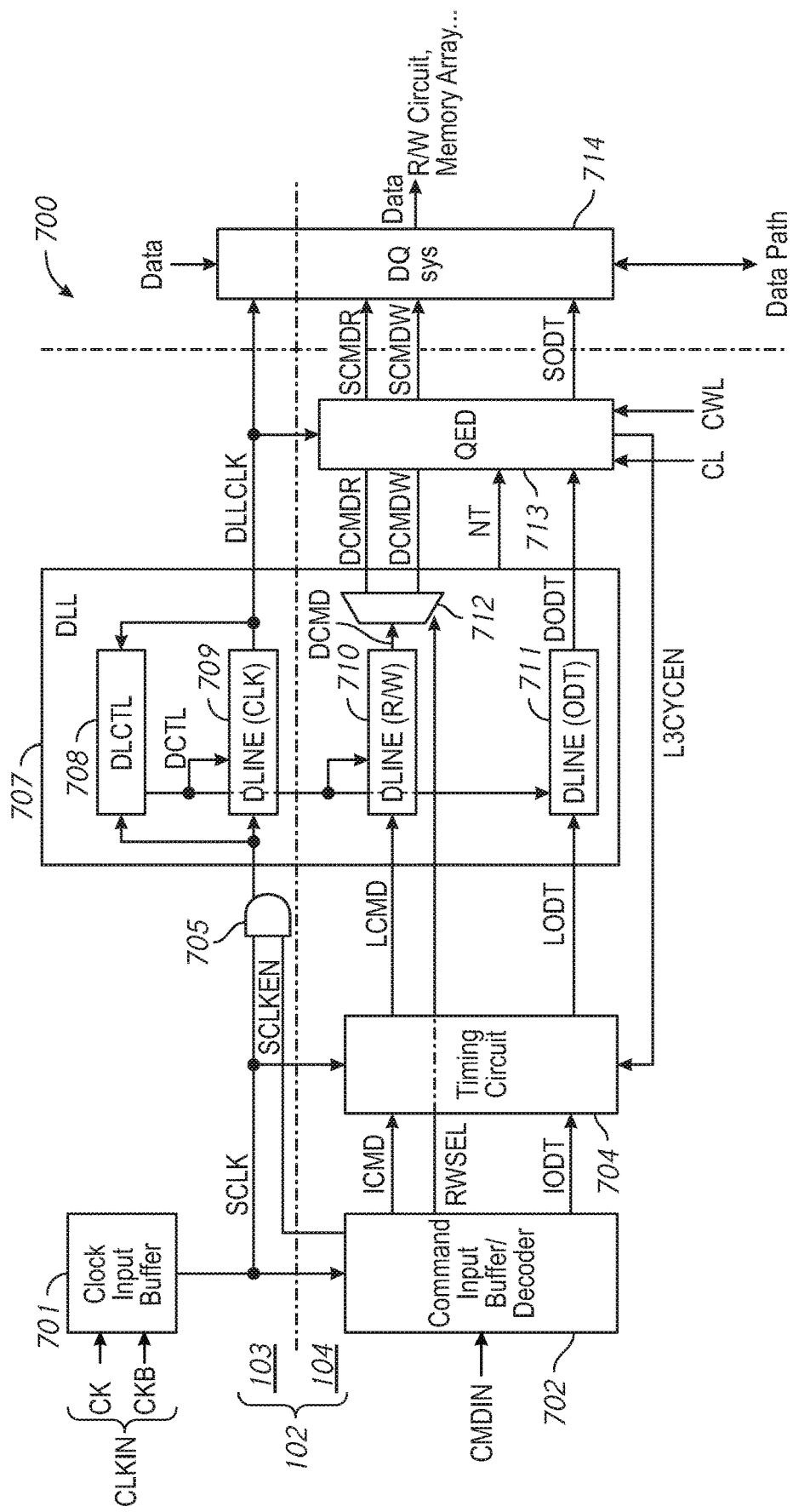
FIG. 7 is a block diagram of a control circuit, in accordance with an embodiment of the present disclosure.

FIG. 7 is a block diagram of the control circuit of FIG. 1, in accordance with an embodiment of the present disclosure. For example, the control circuit 700 may be used as the control circuit 102 in FIG. 1 that may include the clock path 103 and the command path 104. The control circuit 700 may include a timing circuit 704 in the command path and a delay (DLL) circuit 707 among the clock path 103 and the command path 104. The clock path 103 includes a clock input buffer 701 that may function as the clock input buffer 201 in FIG. 2. The SCLK signal may be provided to a command input buffer/decoder circuit 702 and a timing circuit 704 on the command path 104, and an AND circuit 705 on the clock path 103.

The DLL circuit 707 may include a delay line (DLINE CLK) 709 and a delay control (DLCTL) circuit 708 on the clock path 103. The SCLK signal may be provided to a delay line (DLINE CLK) 709 on the clock path 103 via the AND circuit 705 that may provide the SCLK signal responsive to a system clock enable signal SCLKEN responsive to the CMDIN signal indicative of the read command, the write command or the ODT command. For example, the delay line 709 may be an adjustable delay line including a duty cycle controller (DCC), a coarse delay line and a fine delay line. An adjustable delay of the delay line 709 may be based on a delay control signal DCTL provided by the DLCTL circuit 708. The delay line 709 may provide a DLL clock signal DLLCLK having the adjustable delay relative to the SCLK signal on the clock path 103. The DLCTL circuit 708 may provide the DCTL signal responsive to the SCLK signal from the AND circuit 705 and the DLLCLK signal. The delay line 709 may further provide the DLLCLK signal to a dQ-Enable-Delay (QED) circuit 713 on the command path 104.

The command path 104 in the control circuit includes the command input buffer/decoder circuit 702. The command input buffer/decoder circuit 702 may receive command signals CMDIN and the SCLK signal. The CMDIN signals may convey a memory access command, such as a read command, a write command, or an on-die termination (ODT) command indicative of instructing a read operation, a write operation or an on-die termination, respectively. The command input buffer/decoder circuit 702 may decode the CMDIN signals, responsive to the SCLK signal. The command input buffer/decoder circuit 702 may provide an internal command signal ICMD to the timing circuit 704 and may further provide a read/write selection signal RWSEL indicative or read operation or write operation and the SCLKEN signal responsive to the CMDIN signal indicative of the read command, the write command or the ODT command. The ICMD signal may be a read signal or a write signal. The timing circuit 704 may provide a latched command signal LCMD responsive to the ICMD signal, where the timing circuit 704 may control a timing of the LCMD signal relative to the ICMD signal. The command input buffer/decoder circuit 702 may provide an internal ODT command signal IODT to the timing circuit 704 responsive to the CMDIN signal indicative of the ODT command. The IODT signal may be an on-die termination signal. The timing circuit 704 may provide a local ODT command signal LODT responsive to the IODT signal and an L3CYCEN signal that may be described later in detail. The timing circuit 704 may control a timing of the LODT signal relative to the IODT signal.

The DLL circuit 707 may further include a delay line (DLINE R/W) 710 and a delay line (DLINE ODT) 711 coupled to the timing circuit 704 on the command path 104. For example, each of the delay lines 710 and 711 may be an adjustable delay line including a DCC, a coarse delay line and a fine delay line. In some embodiments, the delay lines 710 and 711 may have substantially the same circuit structure as the delay line 709 and may provide substantially the same delay as the delay line 209. The LCMD signal from the timing circuit 704 is transmitted to the delay line 710. The delay line 710 may provide a delayed command signal DCMD responsive to the LCMD signal and further responsive to the DCTL signal that is based on the SCLK signal and the DLLCLK signal. The DCMD signal may be transmitted to a demultiplexer 712. The demultiplexer 712 may provide either a delayed command read signal DCMDR or a delayed command write signal DCMDW responsive to the read command or the write command. The LODT signal from the timing circuit 704 is transmitted to the delay line 711. The delay line 711 may provide a delayed ODT signal DODT responsive to the LODT signal and further responsive to the DCTL signal that is based on the SCLK signal and the DLLCLK signal.

The command path 104 further includes the QED circuit 713. The QED circuit 713 may receive a selected latency (e.g., a CL value and/or a CWL value) and an NT value. Description of the latency and the NT value corresponding to the latency and the NT value in FIG. 2 will not be repeated. The QED circuit 713 may further receive the DLLCLK signal from the delay line 709. The QED circuit 713 may synchronize the DCMDR signal or the DCMDW signal from the demultiplexer 712, or the DODT signal from the delay line 711 with the DLLCLK signal from the delay line 709, for example, by adjusting a latency (e.g., shifting) of the DCMDR signal, the DCMDW signal or the DODT signal using the NT value and the CL value or the CWL value. For example, in some embodiments, the QED circuit 713 may shift the DCMDR signal for the read command responsive to the CL. In some embodiments, the QED circuit 713 may shift the DCMDW signal for the write command responsive to the CWL. In some embodiments, the QED circuit 713 may shift the DODT signal for the ODT command responsive to the CWL. Description of an adjustment factor based on the NT value corresponding to the adjustment factor in FIG. 2 will not be repeated. For example, in read operations, if the (CL−NT) is greater than the predetermined value, the L3CYCEN signal may be activated and the timing circuit 704 may perform a three-cycle-operation that will be described later in detail. If the (CL−NT) is less than or equal to the predetermined value, the timing circuit 704 may perform a two-cycle-operation that will be described later in detail. In operation, the read command or the write command represented by the CMDIN signal is provided to the command path 104 and propagated through the command input buffer/decoder circuit 702 as the ICMD signal, the timing circuit 704 as the LCMD signal, the delay line 710 as the DCMD signal, the demultiplexer 712 as the DCMDR signal or the DCMDW signal, and the QED circuit 713. The ODT command represented by the CMDIN signal is provided to the command path 104 and propagated through the command input buffer/decoder circuit 702 as the IODT signal, the timing circuit 704 as the LODT signal, the delay line 711 as the DODT signal, and the QED circuit 713. The QED circuit 713 adds clock cycles of the DLLCLK signal to the propagating command signal, either the DCMDR signal, the DCMDW signal or the DODT signal to provide a shifted command read signal SCMDR, a shifted command write signal SCMDW or the SODT signal resulting propagation delay for the command path 104 responsive to the selected latency.

The I/O data block 134 in FIG. 1 may include the DQ sys circuit 714 in FIG. 7. The DQ sys circuit 714 may receive the DLLCLK signal and the SCMDR signal, the SCMDW signal or the SODT signal. For example, the DQ sys circuit 714 may include a parallel-serial converter which converts data of a plurality of bits read in parallel from the memory array 101 in FIG. 1 via the R/W circuit 130 to a set of serial data in an appropriate order based on the timings. The DQ sys circuit 714 may provide the data to a data queue (e.g., DQx) on a data path.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
  a control circuit comprising:
    a delay circuit configured to receive a command latency associated with a memory command and to calculate a number of clock cycles for a selection signal based on a comparison of the command latency and a latency of the system clock signal relative to a delay line clock signal to a predetermined clock value; and
    a selector circuit coupled to first and second timing circuits and configured to receive the selection signal indicative of a selection of the first timing circuit or the second timing circuit, wherein a logic level of the selection signal indicates the number of clock cycles in an operation of the first timing circuit responsive to a first delayed clock signal or of the second timing circuit responsive to a second delayed clock signal.

2. The apparatus of claim 1, wherein the control circuit further comprises a delay line coupled to the delay circuit and configured to provide the command latency associated with the memory command.

3. The apparatus of claim 1, wherein the first timing circuit is configured to latch a first signal responsive to the first delayed clock signal and further configured to provide a first latched signal responsive to one of first and second clock signals, wherein the first delayed clock signal is a delayed version of the first clock signal, and wherein the second delayed clock signal is a delayed version of the second clock signal.

4. The apparatus of claim 3, wherein the second timing circuit is configured to latch the first signal responsive to the second delayed clock signal and further configured to provide a second latched signal responsive to one of the first and second clock signals.

5. The apparatus of claim 4, wherein the second timing circuit is coupled in parallel to the first timing circuit.

6. The apparatus of claim 3, further comprising:
  a first delay circuit configured to receive the first clock signal and further configured to provide the first delayed clock signal responsive, at least in part, to the first clock signal; and
  a second delay circuit configured to receive the second clock signal and further configured to provide the second delayed clock signal responsive, at least in part, to the second clock signal.

7. The apparatus of claim 3, wherein the second clock signal is complementary to the first clock signal.

8. The apparatus of claim 3, further comprising a divider circuit configured to receive a third clock signal and further configured to provide the first and second clock signals by dividing a frequency of the third clock signal.

9. The apparatus of claim 3, wherein the first signal is an on-die termination (ODT) signal.

10. An apparatus comprising:
  a first circuit configured to latch a command signal responsive to a first clock signal;
  a second circuit configured to latch the command signal responsive to a second clock signal, the second clock signal being complementary to the first clock signal;
  a third circuit;
  a fourth circuit; and
  a selector circuit;
  wherein the selector circuit is configured, in a first cycle operation, to cause the third circuit to latch a signal based on an output of the first circuit responsive to a third clock signal and the fourth circuit to latch a signal based on an output of the second circuit responsive to a fourth clock signal that is complementary to the third clock signal, the third clock signal being in advance of the first clock signal in phase, the fourth signal being in advance of the second clock signal in phase; and wherein the selector circuit is further configured, in a second cycle operation, to cause the third circuit to latch the signal based on the output of the second circuit responsive to the third clock signal and the fourth circuit to latch the signal based on the output of the first circuit responsive to the fourth clock signal.

11. The apparatus of claim 10,
wherein the third circuit is configured to couple to the first circuit to receive the signal based on the output of the first circuit and the fourth circuit is configured to couple to the second circuit to receive the signal based on the output of the second circuit; and
wherein the selector circuit is supplied with the third and fourth clock signals and configured, in the first cycle operation, to provide the third clock signal to the third circuit and the fourth clock signal to the fourth circuit and, in the second cycle operation, to provide the third clock signal to the fourth circuit and the fourth clock signal to the third circuits.

12. The apparatus of claim 11,
wherein the selector circuit is further supplied with a cycle control signal; and
wherein the cycle control signal is set to a first state to designate the first cycle operation and to a second state to designate the second cycle operation.

13. The apparatus of claim 11, further comprising:
a first delay circuit configured to provide the first clock signal responsive to the third clock signal; and
a second delay circuit configured to provide the second clock signal responsive to the fourth clock signal.

14. The apparatus of claim 13, further comprising a frequency divider circuit configured to provide third and fourth clock signals responsive to a system clock signal, each of the third and fourth clock signals being lower in frequency than the system clock signal.

15. The apparatus of claim 11, further comprising an output node coupled to the third and fourth circuits to provide a latched command signal.

16. The apparatus of claim 10,
wherein the third and fourth circuits are configured to receive the third and fourth clock signals, respectively; and
wherein the selector circuit is configured, in the first cycle operation, to provide the signal based on the output of the first circuit to the third circuit and the signal based on the output of the second circuit to the fourth circuit and, in the second cycle operation, the signal based on the output of the first circuit to the fourth circuit and the signal based on the output of the second circuit to the third circuit.

17. The apparatus of claim 16,
wherein the selector circuit is supplied with a cycle control signal; and
wherein the cycle control signal is set to a first state to designate the first cycle operation and to a second state to designate the second cycle operation.

18. The apparatus of claim 16, further comprising:
a first delay circuit configured to provide the first clock signal responsive to the third clock signal; and
a second delay circuit configured to provide the second clock signal responsive to the fourth clock signal.

19. The apparatus of claim 18, further comprising a frequency divider circuit configured to provided third and fourth clock signals responsive to a system clock signal, each of the third and fourth clock signals being lower in frequency than the system clock signal.

20. The apparatus of claim 16, further comprising an output node coupled to the third and fourth circuits to provide a latched command signal.

21. A method comprising:
receiving a first clock signal;
providing a second clock signal and a third clock signal that is complementary signal of the second clock signal;
comparing, to a predetermined clock value, a command latency associated with a memory command and a latency of the first clock signal relative to a delay line clock signal;
calculating a number of clock cycles for a selection signal based on the comparison to the predetermined clock value;
selecting, based on a selection signal including a logic level, the second clock signal or the third clock signal to be provided as a selected signal for timing the latching of a first signal and a second signal, wherein the logic level indicates the number of clock cycles for timing the latching of the first signal and the second signal responsive to a delayed version of the second clock signal, and
latching the second signal responsive to either the second clock signal or the third clock signal according to the selected signal.

22. The method of claim 21 further comprising:
providing the delayed version of the second clock signal responsive to the second clock signal; and
latching the first signal responsive to the delayed version of the second clock signal to provide the second signal.

23. The method of claim 21, wherein each of the second clock signal and the third clock signal having a frequency that is half a frequency of the first clock signal.

24. The method of claim 21 further comprising:
providing either the second clock signal or the third clock signal as a fourth clock signal, according to the selected signal; and
latching the second signal responsive to the fourth clock signal.

25. A method comprising:
receiving a first clock signal;
providing a second clock signal and a third clock signal that is complementary signal of the second clock signal;
selecting, based on a selection signal including a logic level, the second clock signal or the third clock signal to be provided as a selected signal for timing the latching of a first signal and a second signal, wherein the logic level indicates a number of clock cycles for timing the latching of the first signal and the second signal responsive to a delayed version of the second clock signal;
latching the second signal responsive to either the second clock signal or the third clock signal according to the selected signal;
latching the first signal responsive to a delayed version of the third clock signal to provide a third signal;
providing either the second signal or the third signal as a fourth signal, according to the selected signal; and
latching the fourth signal responsive to the second clock signal.

* * * * *